(12) United States Patent
Chung (10) Patent No.: US 6,938,783 B2
(45) Date of Patent: Sep. 6, 2005

(54) CARRIER TAPE

(75) Inventor: Kevin Kwong-Tai Chung, Princeton, NJ (US)

(73) Assignee: Amerasia International Technology, Inc., Princeton Junction, NJ (US)

( * ) Notice: Subject to any disclaimer, the term of this patent is extended or adjusted under 35 U.S.C. 154(b) by 0 days.

(21) Appl. No.: 09/915,122

(22) Filed: Jul. 25, 2001

(65) Prior Publication Data

US 2002/0014465 A1 Feb. 7, 2002

Related U.S. Application Data

(60) Provisional application No. 60/234,709, filed on Sep. 22, 2000, provisional application No. 60/228,196, filed on Aug. 25, 2000, provisional application No. 60/227,463, filed on Aug. 24, 2000, provisional application No. 60/223,810, filed on Aug. 8, 2000, and provisional application No. 60/220,915, filed on Jul. 26, 2000.

(51) Int. Cl.[7] ............................................... A47G 19/08
(52) U.S. Cl. ................................. 211/41.18; 206/713
(58) Field of Search ........................... 211/41.18, 13.1; 206/713, 710, 722, 725, 454; 428/40.1

(56) References Cited

U.S. PATENT DOCUMENTS

| | | | | |
|---|---|---|---|---|
| 3,554,125 A | * | 1/1971 | Van Dorn et al. | 101/451 |
| 3,637,377 A | * | 1/1972 | Hallman et al. | 216/40 |
| 3,660,088 A | * | 5/1972 | Lundsager | 430/273.1 |
| 4,001,065 A | * | 1/1977 | Penneck et al. | 156/189 |
| 4,286,047 A | | 8/1981 | Bennett et al. | |
| 4,606,962 A | | 8/1986 | Reylek et al. | |
| 4,667,944 A | | 5/1987 | Althouse | |
| 4,711,014 A | | 12/1987 | Althouse | |
| 4,769,399 A | | 9/1988 | Schenz | |
| 4,778,326 A | | 10/1988 | Althouse et al. | |
| 4,811,081 A | * | 3/1989 | Lyden | 257/668 |
| 4,894,283 A | * | 1/1990 | Wehr | 428/32.61 |
| 4,915,994 A | * | 4/1990 | Begelfer et al. | 428/40.6 |
| 4,931,782 A | * | 6/1990 | Jackson | 178/18.01 |
| 4,994,322 A | * | 2/1991 | Delgado et al. | 428/343 |
| 5,101,420 A | * | 3/1992 | Kushibiki et al. | 378/35 |
| 5,118,567 A | | 6/1992 | Komiyama et al. | |
| 5,132,773 A | * | 7/1992 | Braden et al. | 257/702 |
| 5,203,143 A | | 4/1993 | Gutentag | |
| 5,221,642 A | * | 6/1993 | Burns | 148/DIG. 99 |
| 5,258,236 A | * | 11/1993 | Arjavalingam et al. | 428/620 |
| 5,260,173 A | * | 11/1993 | Birkholm | 430/258 |

(Continued)

OTHER PUBLICATIONS

Tempo Electronics, "Surftape", Jul. 16, 1994, 1 Sheet.

*Primary Examiner*—David Purol
(74) *Attorney, Agent, or Firm*—Dann, Dorfman, Herrell & Skillman, P.C.

(57) ABSTRACT

A carrier structure comprises a carrier base which is not thermally deformable and a portion of which is also transparent to electromagnetic radiation. An adhesive layer is disposed on a surface of the carrier base. Semiconductor chips or other items adhere to the adhesive layer, which is cross-linked when it is desired to remove the chips. Once the chips have been removed, the adhesive layer may be removed from the carrier base. The carrier base can be re-used to transport and hold semiconductor chips after application of a new adhesive layer. A carrier frame may releasably support the carrier base.

36 Claims, 2 Drawing Sheets

U.S. PATENT DOCUMENTS

| | | | |
|---|---|---|---|
| 5,284,091 A | 2/1994 | Kon et al. | |
| 5,356,949 A | 10/1994 | Komiyama et al. | |
| 5,391,602 A * | 2/1995 | Skoultchi | 522/90 |
| 5,442,229 A * | 8/1995 | Mori et al. | 257/666 |
| 5,448,450 A * | 9/1995 | Burns | 257/668 |
| 5,452,182 A * | 9/1995 | Eichelberger et al. | 174/254 |
| 5,476,566 A | 12/1995 | Cavasin | |
| 5,524,339 A * | 6/1996 | Gorowitz et al. | 29/840 |
| 5,528,075 A * | 6/1996 | Burns | 257/666 |
| 5,534,094 A * | 7/1996 | Arjavalingam et al. | 156/155 |
| 5,590,787 A | 1/1997 | Hodges | |
| 5,639,811 A * | 6/1997 | Plamthottam et al. | 428/355 AC |
| 5,654,877 A * | 8/1997 | Burns | 257/668 |
| 5,682,731 A | 11/1997 | Althouse | |
| 5,695,837 A * | 12/1997 | Everaerts et al. | 428/317.1 |
| 5,723,191 A * | 3/1998 | Plamthottam et al. | 428/354 |
| 5,769,237 A | 6/1998 | Althouse et al. | |
| 5,780,151 A * | 7/1998 | Miller et al. | 427/207.1 |
| 5,908,114 A | 6/1999 | Althouse et al. | |
| 5,910,370 A * | 6/1999 | Katsura et al. | 428/352 |
| 5,914,216 A * | 6/1999 | Amou et al. | 430/280.1 |
| 5,915,168 A * | 6/1999 | Salatino et al. | 438/106 |
| 5,932,485 A * | 8/1999 | Schofield | 438/690 |
| 5,972,152 A * | 10/1999 | Lake et al. | 156/247 |
| 5,998,018 A * | 12/1999 | Murakami et al. | 428/343 |
| 6,036,809 A * | 3/2000 | Kelly et al. | 156/230 |
| 6,063,838 A * | 5/2000 | Patnode et al. | 523/172 |
| 6,140,006 A * | 10/2000 | Komatsu et al. | 430/156 |
| 6,143,117 A * | 11/2000 | Kelly et al. | 156/233 |
| 6,143,674 A * | 11/2000 | Marutsuka | 428/329 |
| 6,169,138 B1 * | 1/2001 | Petit et al. | 524/500 |
| 6,174,578 B1 | 1/2001 | Holley | |
| 6,188,174 B1 * | 2/2001 | Marutsuka | 313/313 |
| 6,229,085 B1 * | 5/2001 | Gotoh et al. | 174/35 MS |
| 6,248,428 B1 * | 6/2001 | Asai et al. | 174/259 |
| 6,290,589 B1 * | 9/2001 | Tolles | 451/526 |
| 6,297,072 B1 * | 10/2001 | Tilmans et al. | 438/106 |
| 6,316,289 B1 * | 11/2001 | Chung | 438/118 |
| 6,353,420 B1 * | 3/2002 | Chung | 343/895 |
| 6,409,859 B1 * | 6/2002 | Chung | 156/69 |
| 6,428,650 B1 * | 8/2002 | Chung | 156/250 |
| 6,432,253 B1 * | 8/2002 | Chung | 156/295 |
| 6,433,481 B1 * | 8/2002 | Marutsuka | 313/479 |
| 6,491,781 B1 * | 12/2002 | Kreckel et al. | 156/277 |
| 6,531,021 B1 * | 3/2003 | Loncar et al. | 156/247 |
| 6,613,412 B1 * | 9/2003 | Dressler | 428/41.8 |

* cited by examiner

CARRIER TAPE

This Application claims the benefit of U.S. Provisional Application Ser. No. 60/220,915, filed Jul. 26, 2000; of U.S. Provisional Application Ser. No. 60/223,810, filed Aug. 8, 2000; of U.S. Provisional Application Ser. No. 60/227,463, filed Aug. 24, 2000; of U.S. Provisional Application Ser. No. 60/228,196, filed Aug. 25, 2000; and of U.S. Provisional Application Ser. No. 60/234,709, filed Sep. 22, 2000.

The present invention relates to a carrier structure for small items, and in particular to a re-usable carrier structure.

In semiconductor processing, simple adhesive dicing tapes are often used for holding wafers during operations such as lapping and dicing. Many conventional dicing tapes employ lower temperature pressure sensitive adhesive layers such as acrylic adhesive that will disintegrate at temperatures above 200° C. and yet employ a flexible PVC liner or substrate that will change shape at temperatures above 65–70° C. Most flexible and stretchable polymer substrates are not able to withstand high temperature without degradation and/or change of shape or dimension. Flexible semicrystalline polymers, such as PVC, polyethylene, and the like, will melt and thus change shape at temperatures below 150° C. In order to maintain shape above this temperature, the polymer film substrates must be cross-linked, however, most crosslinked polymer films such as nitrile or butadiene rubber, cannot tolerate extended use at temperatures above 150° C. without significant degradation. While some silicone rubbers can be used for high temperature applications, in most cases, the adhesive layer must also be silicone-based. Silicone based adhesives typically leave undesirable residues on the dice or components after they are removed.

Many carrier tape-and-reel packaging arrangements use pressure sensitive tape for transporting electronics and electrical parts. Some employ a specific material composition and film adhesive for the specific application of release-on-command, i.e., controlled release of adhesion by exposure to ultraviolet (UV) light.

UV-releasing pressure-sensitive adhesive tape is used in the dicing of semiconductor wafers to form a structure specifically suitable for handling dice during transportation in replacement of conventional carriers made with silicone gel, however, the structure is a one-time-use only carrier which is costly.

Some carriers use a permanently tacky layer deposited into formed pouches of standard tape-and-reel carriers for retaining devices, and the material within the pouch may be punched out or gapped to reduce the tack strength for easier release. These pouches and punch-outs are disadvantageous because they have to be specifically made for each size component for ease of use in pick-and-place operations.

Conventionally, waffle packs and tape-and-reel packaging that have pockets designed for close tolerance with the dimension of chips or components to be carried are used for carrying applications during transportation, particularly where positioning of the parts is not as critical as for the pick-and-place applications, but such carriers are less useful when dice that are not protected need to be transported. In the case of bare dice, bare dice may be transported using the original dicing tape or, in some cases, waffle packs. In the case of waffle packs, the potential for collisions between the parts carried and the waffle partitions may damage more fragile dice, particularly where the pockets of the waffle pack are not a tight fit to the dice.

Certain waffle packs, trays, and tape-and-reels used for handling dice and components have a silicone-gel coating in a box or tray. These gels suffer from the disadvantage that they transfer silicone monomers and/or oligomers from the gel to the chips or components that are being carried. While silicone gel coatings may be improved to reduce material transfer, the basic problem of silicone migration will exist for any silicone adhesive used in electronic industry.

Conventional carriers have permanent tacky layers and use mechanical means, e.g., ejector pin sets and/or vacuum or suction, to reduce the holding strength to ease release of the part for vacuum pick-and-place operation, to ease the difficulty of removal of the die or chip from the tacky carrier. Packaging trays and containers using non-silicone tacky gels have the same problem of difficult removal of dice.

U.S. Pat. Nos. 5,118,567 and 5,356,949 disclose an e-beam curable adhesive on an e-beam transparent base sheet. In these patents, the adhesive tape is diced with the semiconductor wafer and not detached from the resulting chips; rather, the cured tape is re-tackified by heating and becomes the adhesive by means of which the chips are next attached to the larger component. Clearly, this adhesive will not be desirable for every application, including those which require attachment by soldering.

Accordingly, there is a need for a carrier structure that can resist thermal deformation at the high temperatures at which many manufacturing processes are commonly conducted, at least about 80° C. One aspect of this need is for a carrier structure that resists deformation at temperatures of about 100–150° C. at which water is usually baked off electronic components. Another aspect is for a carrier structure that resists deformation at temperatures of about 220–350° C. at which soldering operations are usually conducted. Finally, there is also a need for a carrier structure that can be re-used easily and economically.

To these ends, the present invention is a carrier structure comprising a carrier base which is not thermally deformed at temperatures less than about 80° C. and which is also transparent to electromagnetic radiation. An adhesive layer is disposed on a surface of the carrier base. Carried objects adhere to the adhesive layer, which is crossed-linked when it is desired to remove the objects. The adhesive layer is removable from the carrier base. The carrier base can be re-used to transport and hold other objects after application of another adhesive layer.

A re-usable carrier structure for carrying an article comprises a carrier base having at least a portion thereof transparent to electromagnetic radiation, a surface of the carrier base having different properties from a surface of the article, and the carrier base being stable to resist deformation by heat at temperatures less than or equal to about 80° C. An adhesive layer disposed on the carrier base is cross-linkable by electromagnetic radiation, heat, or both heat and electromagnetic radiation, and the adhesive layer has a different release profile from the surface of the article than from the surface of the carrier base.

BRIEF DESCRIPTION OF THE DRAWINGS

The detailed description of the preferred embodiments of the present invention will be more easily and better understood when read in conjunction with the FIGURES of the Drawing which include.

In the Drawings, where an element or feature is shown in more than one drawing figure, the same alphanumeric designation may be used to designate such element or feature in each figure, and where a closely related or modified element is shown in a figure, the same alphanumerical designation primed may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features of the drawing are not to scale, and the dimensions of the various features are arbitrarily expanded or reduced for clarity.

DESCRIPTION OF THE PREFERRED EMBODIMENTS

The carrier of the present invention is useful in many fields, such as in manufacturing, where many small items or devices must be transported or held in such a manner that they are secure from physical or environmental damage, or are held steady during a manufacturing operation, yet the items must be released from their holders in order to be processed further or assembled into other items.

The carrier structure of the present invention can be used, for example, as a holder for silicon or other semiconductor wafers during lapping and dicing and other semiconductor processing operations after which the wafer must be easily releasable. The present invention also finds application in such apparatus as a low tack adhesive film or layer with a waffle-pack, a tape-and-reel cavity, or a simple carrier tray for bare dice, surface mount components, and other electrical and/or electronic parts and/or devices, as well as mechanical and other parts and devices.

The definitions below apply to certain terms as they are used herein, unless otherwise limited in specific instances, either individually or as part of a larger group, or by the context.

As used herein, the term "about" means that dimensions, sizes, tolerances, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

"Thermal-UV" means either ultraviolet radiation, heat, or both ultraviolet radiation and heat. Heat may include conventional thermal heating, infrared, ultrasonic, microwave or other energy.

"Cross-linking" and "curing" are used interchangeably herein to signify reactions wherein polymer molecules become covalently bound to one another.

The terms "objects", "chips", "wafers", "dice", "devices", "components", "items" and "parts" are used interchangeably to refer to semiconductor dice, packaged components, modules, passive components, mechanical parts, pellets, pills, any electronic or electrical parts or devices, and/or any other items or devices or objects which may be transported or held as part of any storage, handling, transport, shipping, manufacturing, application, or other process.

The terms "manufacturing process", "process", and "operation" are used interchangeably herein to refer to any method involving moving or transporting or handling an object, attaching it to or releasing it from another object, or changing a component or object physically or chemically or electrically. Processes and operations also include the transportation and/or shipping of components to or from the location at which they are to be made, processed, handled, stored and/or used.

The terms "base", "substrate" and "liner" are used interchangeably herein to refer to layers whose function is to support and/or to provide mechanical strength to one or more other layers.

"Energy" and "radiation" and "electromagnetic radiation" are used interchangeably herein. "EMR" means electromagnetic radiation of any wavelength, and includes, for example, visible light, ultraviolet (UV) light, infrared radiation, radio waves, microwaves, e-beam radiation, and the like.

"Tacky" and/or "tackiness" generally refers to a property of an adhesive to adhere to or stick to what it comes into contact with, and is often used in relation to so-called pressure-sensitive adhesives.

"Peel strength" is a measure of the strength of the bond provided by an adhesive. Peel strength is typically measured by bonding a one-inch wide tape of a material to a planar surface using the adhesive, and then peeling the tape from the surface at a constant rate and measuring the force needed to peel the tape. The tape is peeled at an angle of about 180° with respect to the surface, i.e. the tape is peeled back over itself close to the surface in a direction parallel to the surface. Peel strength is typically expressed in units of the peeling force divided by tape width, commonly in "grams per inch" ("grams/inch or "gm/in") in the United States. While the commonly used grams/inch ("gm/in") is in mixed SI and English units, it may be converted to purely English units or purely SI units by standard conversion factors.

Carrier structures of the present invention comprise a cross-linkable tacky adhesive layer 2 that loses a substantial portion of its adhesive strength upon exposure to thermal-UV or other suitable forms of energy (EMR) that activate cross-linking. The adhesive is preferably sufficiently tacky to hold objects securely enough for the manufacturing or other process, e.g., during semiconductor lapping and dicing operations. When the operations requiring secure holding are completed, the tacky layer is exposed to cross-linking radiation. As the tacky layer is cross-linked, it loses its tackiness, and the parts are easily removed from the carrier structure. This reduction of tackiness and adhesion may be induced almost instantaneously by curing of the tacky layer with EMR, preferably with thermal-UV energy.

Preferably, the tacky layer crosslinks to lose the majority (e.g., about 51% or more) of its adhesive strength upon exposure to cross linking energy, and more preferably loses about 70% or more of its adhesive strength.

Figure 1:
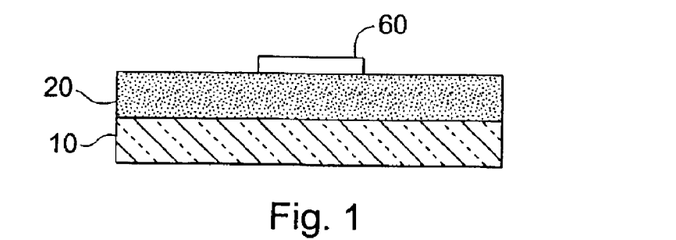
FIG. 1 is a cross-section schematic diagram of a two-layer carrier structure according to the invention, comprising a carrier liner and an adhesive layer.

FIG. 1 is a cross-section schematic diagram of a two-layer carrier structure comprising a carrier liner 10 and a cross-linkable adhesive layer 20. Carrier structures of the present invention may also include cross-linkable adhesive layers 20 comprising a combination of permanent tacky controlled peel strength adhesive and thermal-UV releasing adhesive within a single layer 20. Thus, differential peel strength is produced after thermal-UV exposure. The adhesive layer 20 first releases the chips or other objects carried and then releases the carrier base 10, enabling the replacement of adhesive layer 20 for reuse of typical carrier base 10. Such a combination adhesive preferably releases both chips 60 and liner 10 without leaving a residue, and also preferably has greater adhesion to liner 10 than to the chip or other object 60 carried so that the chip is released more easily than is the liner 10, i.e. it has a different release profile from the chip than from the liner 10.

With the use of thermal-UV releasing tacky layer 20, the adhesion is very strong during the transporting and handling, as long as the cross-linkable layer 20 is protected from exposure to thermal-UV energy. The release of the chips 60 is made dramatically easier by exposure of the tacky layer 20 to thermal-UV, generally right before the pick-and-place operation or other use or process.

The adhesive layer 20 or tacky layer 20 is preferably a cross-linked polymer so that residues on the dice or item after release from the cross-linkable adhesive layer 20 are minimized. The adhesive layer 20 is preferably not made with silicone monomers and/or silicone oligomers so as to minimize the problem of silicone migration. Silicone monomer and oligomer residues are known to hinder or even prevent adhesion of later-added materials, such as epoxy adhesive and solder.

The adhesive layer or tacky later 20 is also preferably adjustable to different peel strengths while maintaining its low residue transfer characteristics. The peel strength of available suitable adhesives is typically in the range of about 200 gm/in to over 1000 gm/in. Peel strength may be adjusted by adjusting the ratio of uncured liquid monomer and/or oligomer to the solid binder used. Increasing the liquid portion of a high-molecular weight monomer or oligomer will typically produce greater tackiness and higher peel strength.

It is contemplated that heat or any other type of EMR, such as microwaves, UV, IR, and the like, will be effective to cure the tacky layer 20, although some forms of energy may require more time to cure and activate certain cross-linking functionalities. Any type of energy can be used, however, if properly chosen for compatibility with suitable base materials. UV-thermal cross linking is presently preferred for many applications due to the ease with which release of the carried objects may be controlled, particularly where the processing of the carried objects is performed at elevated temperature. An example thereof is the thermal baking of devices at over 100° C. to drive off moisture that may have been absorbed by such objects. Thermal curing, where utilized, of the thermal-UV releasing structures is typically performed at 50–200° C. depending on the specific application.

In some embodiments, the cross-linkable adhesive layer 20 comprises one or more non-silicone gel-like pressure sensitive adhesives. Suitable adhesives include, for example, types CGL7050-X and UVA7050-X adhesives available from AI Technology Inc. located in Princeton, N.J. Each of these adhesives has a degree of tackiness varying from about 20 to 2000 gm/inch with a primarily non-polar backbone molecular structure, and each is proven to have reasonably good tack on a silicone liner 10. In other embodiments, the same tacky layer components can also be used on other suitable liners 10 including those with both higher and lower surface energy.

In some embodiments, a thermosetting elastomer with epoxy functionality such as cured adhesive films with properties similar to types ESP7450 or CC7450 adhesive (also available from AI Technology in Princeton, N.J.) is utilized in the cross-linkable adhesive layer 20. Types ESP7450 and CC7450 adhesives are both flexible adhesives capable of tolerating operation at temperatures of about 350° C., at least intermittently, without major weight loss or loss of mechanical properties, such as the ability to be stretched by a factor of over 30% without failure. While silicone rubbers may be made to provide such high-temperature and/or adhesion and release properties, silicones do not release cleanly, but leave undesirable silicone residue.

In certain embodiments useful in semiconductor wafer processing, the tackiness during wafer lapping and dicing should be high, e.g., over 200 gm/inch. When the tackiness is over 200 gm/inch, however, the diced parts may be difficult to remove. Thus, in some cases, UV curable or e-beam curing polymer can be cured to cause additional cross-linking to reduce the tackiness to a suitable level (e.g., less than about 50 gm/inch of peel strength is desirable). In such cases, the tacky layer 20 made with a UV curing adhesive such as types UVA7150-X or UVR500 or UVR1000 UV-releasing adhesives with tackiness before curing suitably adjusted will be more suitable. Types UVA7150-X or UVR500 or UVR1000 UV-releasing adhesives are available from AI Technology, Inc. in Princeton, N.J., and can be used as a coating on the cured ESP7450 or CC7450 adhesive layer 20. These adhesives are high enough in tackiness and molecular weight that once the coating is exposed to UV, the tackiness may be reduced from the range of about 200–5000 gm/inch to about 20 gm/inch to facilitate pick-and-place removal, but still firmly retain the diced parts during transportation.

It is noted that the tackiness adjustment desirably is made with the size, weight, and nature of the object 60 to be carried in mind. Where the object 60 has a relatively large smooth area that contacts the tacky adhesive, as is the case for a large area semiconductor chip, a lesser tackiness is sufficient. For an object 60 that has a contact area that is only a relatively small portion of its size, as is the case for a finned surface of a heat sink device, somewhat greater adhesion may be desired.

A product that has similar characteristics of tackiness, but that does leave some residue may be satisfactory if, should residue be transferred, the residue does not interfere with bonding to common die-attach adhesives, electrically conductive adhesives and solder. Those of skill in the art are aware of the difficulty of engineering a polymer with complicated application properties desired: a polymer structure that is both flexible and gel-like with controlled tackiness that will not change even after extensive aging and exposure to high temperature or ambient conditions.

Presently, it is preferable that such polymer should be based on epoxy functionality so that it is more compatible if any residue were to be transferred onto the parts. In some embodiments, commercial gel-like coating or adhesives, such as types CGL 7010 and CGL 7050, and UVG 7550 (also available from AI Technology Inc. in Princeton, N.J.) have been found to be useful for such applications.

Adhesives of the types utilized in other commercially available UV-releasing dicing tapes could be utilized in the present invention. Examples include the adhesives of types 1042R and 1044R tapes available from Ultron Systems Incorporated located in MoorPark California, and of the Adwill-D series, such as types D-218, D-410T and D-670, available from Lintec Corporation of Japan or from Lintec Research Boston, Incorporated of Tempe, Ariz.

All of these polymeric adhesives have a single epoxy functionality and a high molecular weight. Some of the commercially available gels have an amine functionality that has been induced to cross-link with less than one functional equivalent of epoxy. These amine-functional polymers remain gel-like and do not completely form a firm film with elastomer-like properties. This manipulation of the functionality is commonly used in the pre-polymerization of amine curing agent. But the extent of cross-linking must be much higher as the molecular weight of the polymer must be very high, effectively a molecular solid, to prevent residue transfer. Naturally, the same effect would be produced with similar levels of cross-linking functionality and an excess of epoxy over amine groups.

In some embodiments, the tacky adhesive layer 20 used as UV releasing wafer-mounting film comprises types UVR500, UVR1000, WMR500 and/or WMR2000 adhesives available from AI Technology, Inc., types 1042R and 1044R from Ultron Systems Inc., and types D-105V and D-210 available from Lintec Corporation.

The application of cross-linkable adhesive gels onto suitable substrates in the form of trays, waffle-packs (with or without pockets), and tape-and-reels (with or without specific pockets), is substantially different from the application of conventional silicone gels. Both the chemistry of forming of gel-structure and the availability of different tackiness for the specific applications of carrying during transportation give substantial improvements over typical silicone gels, which have no engineering capability of tackiness nor any ability to be modified to adhere to bonding adhesives or solder with or without pre-cleaning. In the case of some silicone gels, even cleaning with suitable solvent is not easy and tends to cause contamination even of other work areas. Such a silicone contamination problem is highly undesirable and must be avoided in most electronic applications, such as semiconductor and board assembly applications, as well as in mechanical applications.

More recently, there is increased use of flip-chip devices whereby the relative repeat position (i.e., pitch, or center-to-center spacing) of the dice must be quite accurate to facilitate alignment during pick-and-place applications. This is also the case for certain ball-grid-array (BGA) packages having finer dimensions, such as fine connection pitch. In such cases, gel-like carrying layer 20 can provide more accurate positioning, and avoids the problem of silicone transfer from a silicone gel. The problem of silicone residue tends to become critical as the size and pitch dimensions of the device connections, such as solder bumps, become smaller. Any defect in soldering within the many bond pads of a BGA package could cause a complete device failure. Thus, silicone migration is becoming even more of a problem, and silicone is to be avoided where possible. For epoxy-based cross-linkable gel adhesives, cleaning, if needed, will not cause residue migration-induced soldering or adhesion problems because the non-silicone polymers have a relatively high surface energy.

Carrier structures of the present invention, for example, as also shown in FIG. 1, also comprise a carrier liner or base 10. At least a portion of liner 10 is transparent to EMR, and preferably transparent to UV and/or e-beam radiation. Liner 10 may also be thermally conductive to increase the efficiency of the cross linking of the tacky layer 20 where layer 20 is thermally cross-linkable.

In certain embodiments, the carrier structure may have anti-static properties. This anti-static effect may be achieved with conductive mesh overlaid on or embedded in the carrier liner 10. If conductive mesh overlay is to be used, it can be printed using conductive ink containing, for example, carbon black or carbon fibers. Alternatively, a fine metal mesh can be laminated over the surface of the substrate 10 using a layer about 5–15 mils thick of polyester or other high glass transition temperature (Tg) thermoplastic, or a blend of high Tg thermoplastic and thermosetting polymers. An appropriate conductive mesh over the transparent carrier substrate or liner 10 will not significantly hinder the transmission of radiation to cure and de-tackify the cross-linking adhesive layer 20.

Figure 2:
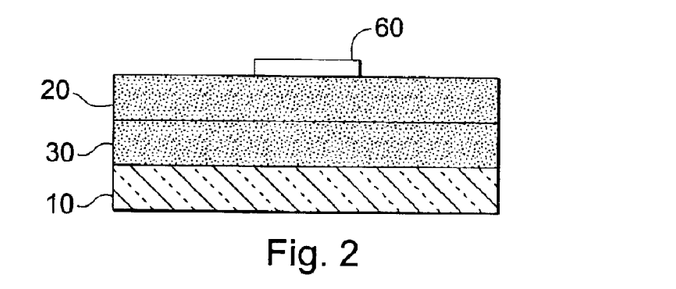
FIG. 2 is a cross-section schematic diagram of a three-layer carrier structure according to the invention, comprising a carrier liner, a cross linkable adhesive layer, and a non-cross linkable adhesive layer.

FIG. 2 is a cross-section schematic diagram of a three-layer carrier structure comprising a carrier liner or base 10, a cross linkable adhesive layer 20, and a non-cross linkable adhesive layer 30. In order to extend the concept of the use of "release-on-command" structure, i.e. by application of suitable EMR, a laminate of adhesive films may be used. This laminate film may have two layers, each with different adhesive characteristics. The layer 20 that contacts objects 60 to be carried such as dice or chip parts 60 may be pressure sensitive with substantial bonding strength of about 100–5000 gm/inch peel strength that will be reduced to less than about 50 gm/inch after cross-linking upon exposure to UV light, heat or other suitable electromagnetic energy, such as microwaves. The electromagnetic energy should be sufficient to overcome the activation energy barrier of the molecular reaction or reactions, e.g., cross linking that will reduce the adhesion characteristics.

The second layer 30 of the adhesive laminate should be coated with a strong adhesive, e.g. about 100–5000 gm/inch, that will not be dramatically affected by thermal-UV or other radiation exposure. This second, non-curable adhesive layer 30 should be easily removable from the carrier base 10, so that the carrier base 10 can be reused after application of a new adhesive laminate. Thus, second layer 30 has a different release profile than does first layer 20.

In typical embodiments, the thickness of the non-curable adhesive layer 30 is about 0.5 to 5.0 mils; however, this may vary widely depending on the demands of the application. The non-curable adhesive should not leave residues on the UV-transparent portion of the carrier. Preferably, adhesion of the non-curable adhesive will not be affected by thermal-UV exposure, but if it is, adhesion should not drop by more than about 50% (and preferably much less than 50%) and should definitely retain at least about 100 gm/inch peel strength.

What is important is that the bond strength between layer 20 and the object carried decrease by a substantial amount to a lower strength than that between layers 20 and 30 and that between layers 30 and 10 Preferably the non-curable layer 30 comprises a controlled release pressure sensitive adhesive that is essentially inert to thermal-UV exposure. Preferably this non-curable tacky layer 30 will retain its strength of adhesion when exposed to UV or other forms of curing energy used to reduce the peel strength of the cross-linkable layer 20 of tacky adhesive.

Preferably, the non-curable layer 30 is not silicone based, or not substantially silicone-based. The cost of the adhesive laminate films should be low so that disposal of the laminate after use in its applications will be economically feasible. Preferably, the non-curable layer 30 has a substantial body as realized with a blend of thermoplastic polymers and less than about 80% of the reacting or non-reacting liquidous portion.

Preferably, the non-curable layer 30 has a gel-like structure, but not substantial segments of molecular structure with low Tg, i.e., Tg below ambient temperatures. Residue transfer to the carrier base 10 may be reduced by maintaining sufficient cross-linked density. Preferably, the non-curable layer 30 is modified with sufficient polarity in its molecular structure to facilitate ease of removal with common solvents such as isopropanol (IPA), acetone, 2-butanone (MEK), and the like. Preferably, the non-curable layer 30 is made with functional groups that have a substantial proportion of mono-functional groups. Mono-functional groups promote curing with sufficient tackiness and peel strength, i.e., greater than about 200–5000 gm/inch.

Preferably, the non-curable layer 30 is synthesized from a blend of thermal plastic elastomer or high molecular weight elastomer and cross-linkable functional monomers. Preferably, such monomers are completely cross-linked in the course of the synthesis with thermal or UV or e-beam or microwave or another appropriate form of energy.

Figure 3:
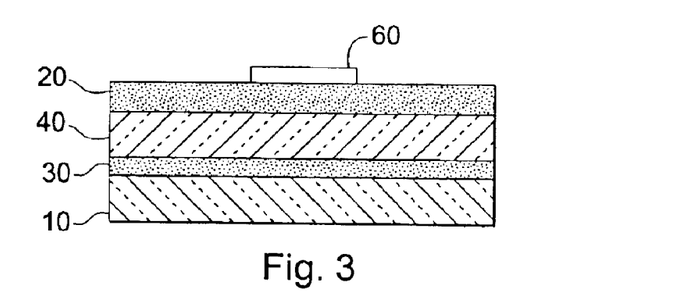
FIG. 3 is a cross-section schematic diagram of a four-layer carrier structure according to the invention, comprising a carrier liner, a cross linkable adhesive layer, and adhesive liner, and a non-cross linkable adhesive layer.

FIG. 3 is a cross-section schematic diagram of a four-layer carrier structure comprising a carrier liner 10, a cross linkable adhesive layer 20, and adhesive liner 40, and a non-cross linkable adhesive or pre-cross-linked adhesive layer 30. In some embodiments, the adhesive layers may be disposed on the surface of an adhesive base or liner 40. This liner 40 should be transparent to UV radiation, or in general should transmit whatever type of radiation is used to cross-link the tacky layer 20. Preferably, the adhesive liner 40 comprises low cost materials such as polyester, acrylic, polycarbonate or other higher surface energy plastic sheet. The adhesive liner 40 should be transparent to UV or microwave or whatever type of EMR is used to crosslink the tacky layer 20. More preferably, the adhesive liner 40 is resistant to deformation at the elevated temperatures at which the carrier structure is intended to be used. One advantage of the adhesive liner 40 is that it facilitates the re-use of the carrier structure by making the removal of the adhesive layers 20 and 30 from carrier base 10 easier.

The above embodiments provide for electromagnetic radiation to penetrate through the carrier structure in order to cross-link the tacky layer 20, as dice and components 60 are typically not transparent to cross-linking radiation. To the extent that the tacky layer 20 is cross-linked by thermal energy, transparency to EMR is less of a concern, although increasing the thermal conductivity of the carrier structure increases the efficiency of the cross-linking. Thus materials such as transparent polystyrene, acrylics, polycarbonate or other EMR-transparent materials are preferably used for molding the carrier structure base 10. Alternatively, the carrier liner 10 may be physically modified, as by the provision of a suitable portion or cavity or window formed in the liner to transmit the EMR. Preferably, the transmission properties of the portion and/or physical modifications are sufficient to allow the tack strength to be reduced to less than about 30% of the original (pre-EMR exposure) value so that the carried devices are readily released during pick-and-place operations.

Figure 4:
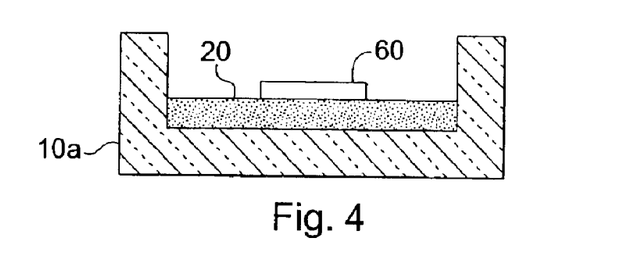
FIG. 4 is a cross-section schematic diagram of an embodiment of the carrier structure according to the invention, wherein the carrier is in the form of a tape, and the carrier tape liner forms a trough.

FIG. 4 is a cross-section schematic diagram of an embodiment of the invention wherein the carrier is in the form of a tape, and the carrier tape liner 10a forms a trough. To maximize opportunities for re-use, it is desirable that the carrier structure be compatible with components or other items 60 to be carried of varying sizes, and not be specifically sized for a particular object. The specific sizes of the carrier structures may or may not follow industrial standards such as those established by JEDEC (Joint Electronics Device Engineering Council) or others.

To this end, the use of a trough configuration tape 10a rather than formation of multiple specific size pockets or pouches facilitates flexibility. In embodiments which the carrier structure is a tape, for example, the width of the carrier tape determines the only restriction on the size of the component 60, and tapes of the same width with different pocket lengths need not be manufactured. Thus fewer versions of these tapes, and the reels on which they are would in tape-and-reel packaging are required. The economics of scale thus obtained further reduce the manufacturing cost and therefore the cost of using such tapes. In addition, the application of the adhesive layer 20 to a long trough-type carrier tape liner 10a is simpler and more economical than the application of an adhesive layer only in the many pockets of a pocket-type liner.

Figure 5A:
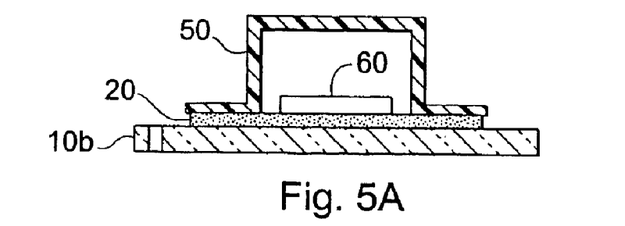
FIGS. 5A and 5B are a cross-section schematic diagram and a plan view schematic diagram, respectively, of an embodiment of the carrier structure according to the invention, wherein the carrier is in the form of a tape.
Figure 5B:
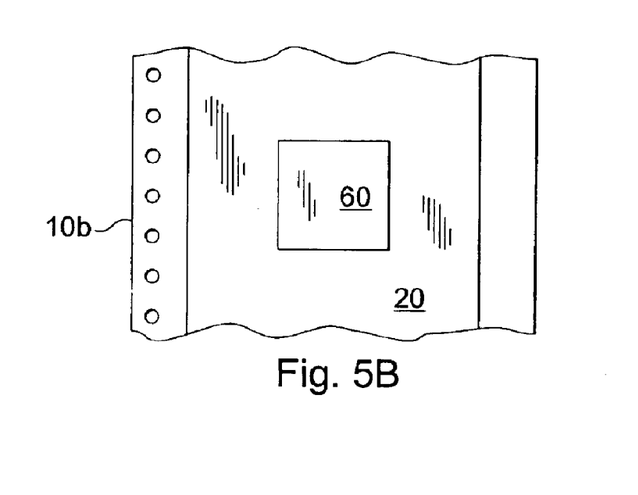

The carrier base or substrate 10a is preferably of suitable rigidity and thickness to control or conform to the flatness of the parts carried. Typically, the cavity or trough of the carrier base 10a is at least as deep as the height of the component or device that it is intended to hold. The carrier base 10a may also be provided advantageously with such other features as are well known in the art, for example, sprocket holes or other means of guiding and/or feeding a carrier structure in the form of a tape. Some of these advantageous optional features are shown in the embodiment depicted in FIGS. 4 and 5 described herein.

In the present invention, high temperature polymers are used as the cross-linkable adhesive of tacky layer 20 and also as the liner 10, 10a for the adhesive 20. These polymer and adhesive layers may be engineered so that the onset of significant degradation occurs at temperatures above about 300° C., and preferably above about 350° C., as measured by standard thermogravimetric analysis (e.g., measurement of weight loss at temperature increase rate of 10° C. per minute under standard atmospheric conditions).

In addition to the thermal stability of the polymer molecular structure under an air atmosphere, this carrier base 10, 10a is preferably a polymer with sufficient cross-linked density such that the tacky adhesive film 20 will not easily or permanently deform under the mechanical forces to which it will be subjected under typical manufacturing conditions. On balance, however, the carrier base 10, 10a should be slightly flexible, for example, to permit realistic or even generous tolerances in alignment with manufacturing equipment. Accordingly, it is preferred that a sufficient portion of the polymer structure have a glass transition temperature (Tg) substantially below ambient temperature and preferably below about 20° C.

Carrier structures of the present invention are laminate films with a mechanical support liner 10, 10a that is typically about 1–10 mils or about 25–250 microns in thickness. Thicker liners 10, 10a can be used for special cases, but for economic reasons, thicknesses of about 3–6 mils are preferred.

Most of the conventional liners currently used are plasticized PVC film that is both inexpensive and has reasonable bonding characteristics, with higher surface energy (over about 40 dyne/cm) to facilitate adhesion to the acrylic pressure sensitive adhesives that commonly constitute the cross-linkable tacky layer being used. While PVC liners are low in cost, they are deformed easily at temperatures above 65–70° C. and thus cannot be used for high-temperature or heat-generating operations, such as lapping or machining. For example, lapping operations to reduce the thickness of a silicon wafer from 20 mils to 1–2 mils generate a substantial amount of frictional heat, with in situ temperatures easily exceeding 70° C.

Other engineering plastics such as polyester and polyimide, while useful for higher temperature applications and having relatively high surface energy of adhesion, lack flexibility and stretchability due to their relatively high modulus of elasticity, typically 1,000,000 psi or greater. Stretching by a factor of about 10–100%, which obtains from flexible adhesives having a much lower modulus of elasticity, may be desirable to mechanically help separate the parts carried from the carrier structure, e.g., after dicing as in the case of a silicon wafer dicing operation. Thus, engineering plastics are not optimal as carrier structure bases.

Among the conventional elastomers that can be stretched, cross-linked elastomers such as silicone rubbers of both the conventional methyl-type and vinyl-type are quite useful in terms of their ability to tolerate higher temperature; however, most acrylic-based pressure sensitive polymers will not adhere well to these substrates and they leave undesirable silicone residue.

A polymer with low enough surface energy to form good bond to the silicone layer must be used. There are very few such pressure sensitive media that can bond to silicone liner 10, 10a, which tends to have the lowest surface energy surface among all polymer structures. In any case, silicone pressure sensitive layers share the common problem of free silicone monomer residue transfer which is to be avoided Examples of suitable substrates or liners 10, 10*a* for such non-silicone gel cross-linkable adhesives are conventional ABS, PET, polycarbonate, polyester, high impact polystyrene, or polysulfone, polyethersulfone, or other engineering plastics or liquid crystal polymers. This substrate 10, 10*a* can be metal or ceramic if suitable plastics cannot provide specific desirable properties, with at least portions being of a suitable EMR transparent material. In most high volume applications, polymers that can be molded offer much lower cost and great versatility in terms of shape and format. Carrier liner 10, 10*a* preferably comprises a non-silicone dielectric such as AI Technology type ESP7450 flexible adhesive which includes cross-linked epoxy with high flexibility, or a combination thereof with a silicone material.

In the case of embodiments intended for use at the lower end of the elevated temperature range, e.g. about 80–150° C., or even at higher temperatures up to about 250° C., some conventional non-silicone rubber such as nitrile or butadiene, or other elastomers may be used. As long as the liner is mechanically and molecularly stable when exposed to the highest temperature of the operation, it may be used for such applications. The elastomeric liners preferably do not include fiberglass or mesh or other support or filler that may impede its ability to be stretched.

FIGS. 5A and 5B are a cross-section schematic diagram and a plan view schematic diagram, respectively, of an embodiment of a carrier structure wherein the carrier is in the form of a tape 10*b* having a cover 50. The carrier structures of the present invention may optionally be provided with an anti-static cover 50 with either a flat tape as illustrated or with a trough tape structure 10*b*. Such a cover structure 50 may have thermal-UV blocking properties and is typically about 5–15 mils thick and may be comprised of PET or another relatively rigid film to provide mechanical protection.

Cover 50 may be secured to tape 10*b* by tacky adhesive layer 20, as illustrated, and so is conveniently released by the same exposure to EMR that is utilized for releasing the chips or other objects carried thereon.

Tape 10*b* is a long strip of carrier base 10*b* material that is slightly wider than is the strip of tacky thermal-UV adhesive 20 disposed thereon. Carrier tape 10*b* may have drive sprockets illustrated by the circular holes along either one or both edges thereof, which holes serve as a means to impart motion (drive) the tape and/or for aligning the tape with respect to apparatus such as pick-and-place equipment.

Figure 6:
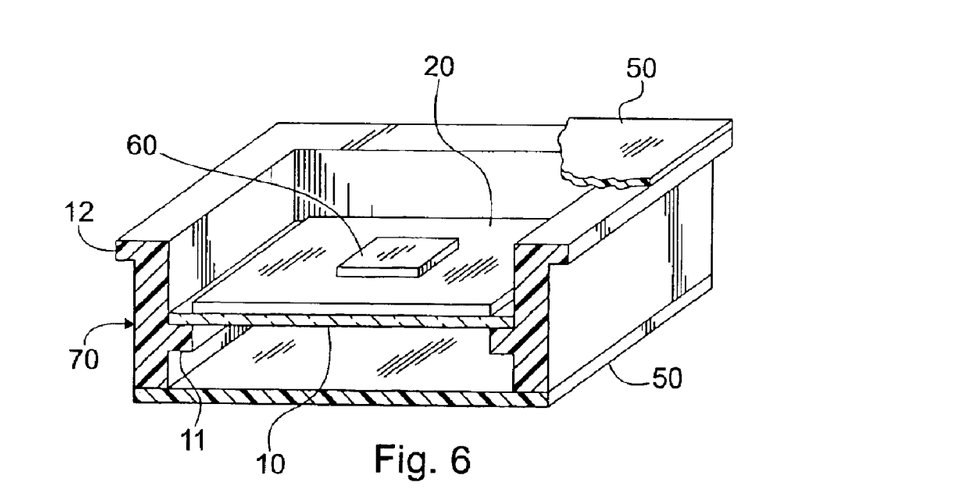
FIG. 6 is a cross-section isometric schematic diagram of an exemplary embodiment of the carrier structure according to the invention, wherein a ledge in the carrier base serves as a support for a removable radiation-transparent insert, upon which the adhesive layer is disposed.

Alternatively and optionally, a cavity or window may be formed in a carrier structure 70 to allow energy (EMR) to pass through carrier base 10 to expose and cure the tacky layer 20 to achieve similar reduction of tackiness of the areas exposed. FIG. 6 is an isometric schematic diagram of an exemplary embodiment of a carrier wherein a ledge 11 in the carrier structure 70 serves as a support for a radiation-transparent carrier base insert 10, upon which the adhesive layer 20 is disposed. Adhesive layer 20 may be any one of the two-layer, three-layer and four-layer embodiments described above. An object 60, such as a semiconductor chip or other electronic component is also shown in place on adhesive layer 20. Alternatively, a transparent rigid backing substrate 10 may be used. The desirable characteristics of such a backing substrate 10 include transparency to the EMR that is used to cure the tacky layer, preferably transparency to UV, microwave or e-beam radiation. Suitable rigid backing substrates 10 include, for example, inorganic glasses such as quartz, silicate glasses or organic glasses such as polycarbonate, polystyrene, and acrylic. Desirably the rigid backing substrate 10 is low enough in cost so that it is economically feasible to discard it after each use.

Also alternatively, and/or optionally, the laminate of adhesive layer 20 is protected from cross linking by UV light before the carrier structure is used by means of a UV barrier release liner 50. Typically, such release liner/cover 50 is placed over tacky layer 20 and over carrier base 10 to block EMR that would crosslink adhesive layer(s) 20 and will be removed from the UV curable tacky layer 20 prior to use. Such block may be restored or applied after the object 60 is placed on tacky layer 20 to block cross-linking EMR until such time as it is desired to release object 60. The carrier base platform 10 may be removable or non-removable from the waffle pack, tape-and-reel, and JEDEC tray configuration, as is desired.

Where carrier structure 70 is a JEDEC carrier, the useful and UV active areas of base 10 have dimensions typically about 5" by about 12". The tray has a ledge 11 for releasably supporting carrier base 10 and retaining lips 12 at least on two long side of the tray so that the platform and the tray can be slightly bent to allow insertion of the removable platform 10. The platform 10 is typically about 1/16" thick. It is apparent that platforms 10 of different thickness or shape or size can be used to create non-standard carriers. The removable platform 10 is preferably constructed with a UV transparent substrate such as glass, acrylic, polycarbonate, and the like. If high temperature exposure is required, for example, baking at 150° C. for an extended period of time to remove moisture from the components, non-shattering glass or cross-linked plastics are often preferred.

In some embodiments, a single layer 20 of thermal-UV curable liquidous mixture with a high temperature stable polymer is made with a typical ratio of liquidous portion in the range of about 30–80% and preferably in the range of about 40–60%. This ratio will assure the adhesive layer 20 has adequate film forming characteristics without an adhesive base or liner 40. Typically a thicker adhesive film 20 in the range of about 2–10 mils thickness will be used if the liner is omitted. The adhesive film 20 will be sandwiched between two UV-opaque release liners to prevent UV cross-linking when not desired. The adhesive-liner assembly 10, 20 can be die-cut to specific preform dimensions to fit the active and useful areas of the platform 10 and carrier structure 70.

In embodiments without a liner 40 for the adhesive layer 20, the adhesive film 20 is preferably synthesized from polymers and liquidous reacting portions having higher surface energy or polar structures. The most preferred molecular backbones for both the polymers and the reacting liquids should have surface tension or energy of more than 50 dyne/cm and preferably above 75 dyne/cm. The higher the surface tension in comparison to the substrate that it is applied onto, the easier it will be to release upon thermal-UV-curing. The compatibility and film forming characteristics are most complete in the range of polymer blend of 20–80% of solid polymer, the rest being that of the reacting liquidous portion. Some of the higher energy polymers include acrylics, polyvinylidene chloride, polyvinylidene fluoride, polyvinyl chloride, polyvinyl fluoride, and the like. Most of these polymers can be used to blend with the polar acrylate and epoxy liquidous monomers or oligomers. Typical thermal-UV, cationic catalysis, or other means of curing may be used to facilitate such thermal-UV releasing film 20.

All of these high-surface-energy polymers may be used for baking out moisture, e.g., at about 150° C. If extended exposure to higher temperature of about 200–350° C. for a few minutes must be used, the more useful polymers will be those of polyvinylidene fluoride or its copolymer. Some of block co-polymers such as Kraton G series made by Shell Chemical Company or similar thermoplastic elastomer resin with high temperature stable backbone may be used. Preferably the adhesive has a higher and more permanent adhesion to the carrier base film or liner 10, 10*a*, 10*b* than to the items to be carried, i.e. has a different release profile to carrier base film or liner 10 than to the items, and that the adhesive layer 20 be of sufficient thickness (typically about 1–5 mil) to hold parts with slightly different flatness tolerances.

In some embodiments, the release of the parts is aided by an ejector pin assembly as is conventional. The pins are projected towards the parts through a flexible layer 10, thus raising the parts for easier grasping. In addition, the flexible layer 10, 10a, 10b is preferably deformed by the ejector pins so that it detaches partially from each part. In this way, the force necessary to remove the parts from the adhesive layer 20 is decreased because of the loss of adhesion caused by thermal-UV curing of adhesive layer 20 as well as by the reduced contact area between the adhesive and the part.

While the present invention has been described in terms of the foregoing exemplary embodiments, variations within the scope and spirit of the present invention as defined by the claims following will be apparent to those skilled in the art. For example, it will be apparent to those of skill in the art that the carriers of the present invention might be trays. Such trays may hold one or more components or items and may optionally be divided into small sub-compartments. Carriers such as waffle packs and JEDEC trays are examples of tray embodiments.

Typical embodiments include waffle packs and JEDEC trays using a thermal-UV releasing tacky layer over a UV transparent substrate. The tacky layer is designed to lose the majority, and preferably more than about 70%, of its adhesive strength upon exposure to UV or other suitable form of energy to activate curing. These carriers may be re-used by removing the thermal-UV layers and applying a fresh tacky layer.

In other embodiments, the carrier structure is in the form of a tape. Tapes are a very compact and convenient means for transporting and holding many parts in a relatively small volume. Tapes also simplify pick-and-place operations by enabling facile placement of each part in one set location for removal from the carrier tape, in contrast with the two dimensional array that is typical of trays.

In a waffle pack, for example, a repeat pattern of holes in the base 10, 10a, 10b are spaced about 1/16" to 1/8" apart and spread evenly over the area of the base of the tray, and the ejector pin-set has a reciprocal matching arrangement similar to a male-female arrangement, such that the pins will pass through the holes to provide an ejection mechanism. In these embodiments, the flexible layer 10, 10a, 10b is preferably a firm, non-silicone elastomer with structural integrity, such as AI Technology types CC7450 or ESP7450. The flexible layer 10, 10a, 10b may optionally support a tacky layer 20 in contact with the parts, and is attached to the carrier, preferably at least at its edges.

In embodiments comprising a removable platform 10 and a replaceable thermal-UV-releasing layer 20, it is estimated that each carrier structure of the present invention can be used at least ten times or more. This re-use provides significant savings in manufacturing costs. For example, if a typical JEDEC tray of $3.00 to $5.00 value is used ten times or more, the cost is less than $0.30–$0.50 per use. It follows that the cost of each tray usage per chip is also reduced by a similar factor.

The cost savings extend to capital investments and costs of repair. The fact that a standard carrier such as a JEDEC tray or universal tray can be used avoids a typical tooling cost of $20,000 to $40,000 for a custom carrier. Even though the tape-and-reel are not typically reused, the fact that a universal tape arrangement can be used also saves the cost of custom tooling and dramatically lowers the overall cost of ownership.

What is claimed is:

1. A re-usable carrier structure for carrying an article, comprising:
   a carrier base having at least a portion thereof transparent to electromagnetic radiation,
   a surface of said carrier base adapted to have a different surface property from a surface of the article,
   said carrier base being stretchable by about 10–100% or by over 30%, and
   said carrier base being stable to resist deformation by heat at temperatures less than or equal to about 80° C.; and
   a removable tacky adhesive layer disposed on said carrier base,
   said removable tacky adhesive layer being cross-linkable when exposed to electromagnetic radiation, heat, or both heat and electromagnetic radiation through said carrier base, to decrease the adhesion and peel strength of said removable tacky adhesive layer, and
   said removable tacky adhesive layer after being cross-linked having a different release profile and peel strength from the surface of the article than from the adapted surface of said carrier base, wherein the article is removable leaving said removable tacky adhesive layer adhering to said carrier base, and wherein said removable tacky adhesive layer is removable from said carrier base without leaving a substantial residue so that said carrier base is available to be reused with another removable adhesive layer.

2. The re-usable carrier structure of claim 1, wherein the carrier base includes a waffle pack, a tray, a JEDEC tray, a tape-and-reel, or a tape.

3. The re-usable carrier structure of claim 1, wherein the electromagnetic radiation is applied to said removable tacky adhesive layer through the portion of said carrier base that is transparent to electromagnetic radiation.

4. The re-usable carrier structure of claim 1, wherein the removable tacky adhesive layer is cross-linkable by heat, by UV radiation, or by both heat and UV radiation.

5. The re-usable carrier structure of claim 1, wherein the removable tacky adhesive layer loses the majority of its peel strength after cross-linking.

6. The re-usable carrier structure of claim 1, wherein the removable tacky adhesive layer loses about 70% of its peel strength after cross-linking.

7. The re-usable carrier structure of claim 1, wherein said carrier base is stable to resist deformation by heat at temperatures less than or equal to about 150° C.

8. The re-usable carrier structure of claim 1, wherein said carrier base is stable to resist deformation by heat at temperatures less than or equal to about 300° C.

9. The re-usable carrier structure of claim 1,
   further comprising a carrier frame,
   wherein said carrier base is releasably supported by the carrier frame.

10. A re-usable carrier structure comprising:
    a carrier base, said carrier base having at least a portion thereof transparent to electromagnetic radiation, and
    said carrier base being stable to resist deformation by heat at temperatures less than or equal to about 80° C.;
    said carrier base being stretchable by about 10–100% or by over 30%; and
    an adhesive laminate disposed on a surface of said carrier base, said adhesive laminate comprising:
    an adhesive base;
    a removable first adhesive layer disposed on a first surface of said adhesive base for removably connecting said carrier base and said adhesive base; and a removable second adhesive layer disposed on a second surface of said adhesive base for providing a tacky carrier surface, said removable second adhesive layer being cross-linkable when exposed to electromagnetic radiation, heat, or both heat and electromagnetic radiation through said carrier base, to decrease the tackiness and peel strength of said removable second adhesive layer.

wherein an article carried on the carrier surface is released said removable second adhesive layer is exposed to electromagnetic radiation applied through the transparent portion of the carrier base, heat, or both heat and electromagnetic radiation applied through the transparent portion of the carrier base, leaving said adhesive laminate on said carrier base, and wherein said adhesive laminate is removable from said carrier base without leaving a substantial residue so that said carrier base is available to be reused with another adhesive laminate.

11. The re-usable carrier structure of claim 10, wherein the carrier base includes a waffle pack, a tray, a JEDEC tray, a tape-and-reel, or a tape.

12. The re-usable carrier structure of claim 10, wherein the electromagnetic radiation is applied to said removable second adhesive layer through the portion of said carrier base that is transparent to electromagnetic radiation.

13. The re-usable carrier structure of claim 10, wherein the removable second adhesive layer is cross-linkable by heat, by UV radiation, or by both heat and UV radiation.

14. The re-usable carrier structure of claim 1, wherein the removable second adhesive layer loses the majority of its peel strength after cross-linking.

15. The re-usable carrier structure of claim 10, wherein the removable second adhesive layer loses about 70% of its peel strength after cross-linking.

16. The re-usable carrier structure of claim 10, wherein said carrier base is stable to resist deformation by heat at temperatures less than or equal to about 150° C.

17. The re-usable carrier structure of claim 10, wherein said carrier base is stable to resist deformation by heat at temperatures less than or equal to about 300° C.

18. The re-usable carrier structure of claim 10, further comprising an adhesive base disposed between said removable first and said second adhesive layers, said adhesive base being stable to degradation at temperatures less than or equal to about 80° C.

19. The re-usable carrier structure of claim 10,
further comprising a carrier frame,
wherein said carrier base is releasably supported by the carrier frame.

20. A re-usable carrier structure comprising
a carrier base having at least a portion thereof transparent to electromagnetic radiation, and
said carrier base being stable to resist deformation by heat at temperatures less than or equal to about 80° C.;
said carrier base being stretchable by about 10–100% or by over 30%;
a removable first adhesive layer removably disposed on a surface of said carrier base; and
a removable second adhesive layer disposed on said first adhesive layer for providing a tacky carrier surface, and
said removable second adhesive layer being cross-linkable when exposed to electromagnetic radiation applied through the carrier base, heat, or both heat and electromagnetic radiation applied through the carrier base, to decrease the tackiness and peel strength of said removable second adhesive layer, wherein an article carried on the carrier surface is released when said removable second adhesive layer is cross-linked by exposure to electromagnetic radiation applied through the transparent portion of the carrier base, heat, or both heat and electromagnetic radiation applied through the transparent portion of the carrier base, leaving the removable first and second adhesive layers on said carrier base, and wherein said removable first and second adhesive layers are removable from said carrier base without leaving a substantial residue so that said carrier base is available to be reused with another adhesive layer.

21. The re-usable carrier structure of claim 20, wherein the carrier base includes a waffle pack, a tray, a JEDEC tray, a tape-and-reel, or a tape.

22. The re-usable carrier structure of claim 20, wherein the electromagnetic radiation is applied to said removable second adhesive layer through the portion of said carrier base that is transparent to electromagnetic radiation.

23. The re-usable carrier structure of claim 20, wherein the removable second adhesive layer is cross-linkable by heat, by UV radiation, or by both heat and UV radiation.

24. The re-usable carrier structure of claim 20, wherein the removable second adhesive layer loses the majority of its peel strength after cross-linking.

25. The re-usable carrier structure of claim 20, wherein the removable second adhesive layer loses about 70% of its peel strength after cross-linking.

26. The re-usable carrier structure of claim 20, wherein said carrier base is stable to resist deformation by heat at temperatures less than or equal to about 150° C.

27. The re-usable carrier structure of claim 20, wherein said carrier base is stable to resist deformation by heat at temperatures less than or equal to about 300° C.

28. The re-usable carrier structure of claim 20, further comprising an adhesive liner disposed between said first and said second adhesive layers, said adhesive liner being stable to thermal degradation at temperatures less than or equal to about 80° C.

29. The re-usable carrier structure of claim 20 further comprising:
a carrier frame,
wherein said carrier base is releasably supported by the carrier frame.

30. A re-usable carrier structure for carrying one or more objects, said re-usable carrier comprising:
a base layer,
wherein at least a portion of said base layer is transparent to electromagnetic radiation,
wherein said base layer is formed of a material that is stable at temperatures less than about 80° C. and is stretchable by about 10–100% or by over 30%; and
a removable adhesive layer disposed on said base layer for adhesively holding one or more objects,
wherein said removable adhesive layer becomes cross-linked upon exposure to electromagnetic radiation applied through the transparent portion of the base layer thereby to exhibit a reduction of adhesiveness and peel strength,
wherein the reduction of adhesiveness and peel strength of said removable adhesive layer to the one or more objects exceeds the reduction of adhesiveness and peel strength of said removable adhesive layer to said base layer,
wherein one or more objects carried on said removable adhesive layer are released when said removable adhesive layer is cross-linked by exposure to electromagnetic radiation applied through the transparent portion of the base layer, and said removable adhesive layer is removable from said base layer without leaving a substantial residue so that said base layer is available to be reused with another adhesive layer.

31. The re-usable carrier of claim 30 further comprising:
a carrier structure,
wherein said base layer is releasably supported by said carrier structure.

32. The re-usable carrier of claim 31, wherein said carrier structure is formed of a material that is stable at temperatures less than about 80° C.

33. The re-usable carrier of claim 30,
wherein said removable adhesive layer comprises first and second adhesive layers exhibiting different adhesiveness,
wherein said first adhesive layer is disposed on said base layer, and
wherein said second adhesive layer is disposed on said first adhesive layer and exhibits greater reduction of adhesiveness than said first adhesive layer.

34. The re-usable carrier of claim 33, further comprising a liner layer disposed between said first and second adhesive layers.

35. A re-usable carrier structure for releasably carrying one or more objects, said re-usable carrier comprising:
a carrier structure having a support member and adapted for receiving a cover;
a carrier base disposed on the support member of said carrier structure, wherein at least a portion of said carrier base is transparent to ultraviolet radiation, and wherein said carrier base is formed of a material that is stable at temperatures less than about 80° C. and is stretchable by about 10–100% or by over 30%; and
a removable cross-linkable tacky adhesive layer disposed on said carrier base for adhesively holding one or more objects, wherein said removable cross-linkable tacky adhesive layer becomes cross-linked upon exposure to ultraviolet radiation applied through the transparent portion of said carrier base layer thereby to exhibit a reduction of adhesiveness and peel strength, and
a cover disposed on said carrier structure, wherein said cover is of a material opaque to ultraviolet radiation for blocking ultraviolet radiation from cross-linking said removable cross-linkable tacky adhesive layer,
wherein one or more objects adapted to be carried on said removable cross-likable tacky adhesive layer are released when said cover is removed and said removable cross-likable tacky adhesive layer is cross-linked by exposure to ultraviolet radiation applied through the transparent portion of the carrier base, and said removable cross-linkable tacky adhesive layer is removable from said carrier base without leaving a substantial residue so that said carrier base is available to be reused with another adhesive layer.

36. A re-usable carrier for releasably carrying one or more objects, said re-usable carrier comprising:
a carrier structure having a support member and adapted for receiving a cover;
a carrier base disposed on the support member of said carrier structure, wherein at least a portion of said carrier base is transparent to ultraviolet radiation, and wherein said carrier base is formed of a material that is stable at temperatures less than about 80° C.; and
a cross-linkable tacky adhesive layer disposed on said carrier base for adhesively holding one or more objects, wherein said adhesive layer becomes cross-linked upon exposure to ultraviolet radiation applied through the transparent portion of said carrier base layer thereby to exhibit a reduction of adhesiveness, wherein the reduction of adhesiveness to the one or more objects is more than about 70% and exceeds the reduction of adhesiveness to said carrier base, and
a cover disposed on said carrier structure, wherein said cover is of a material opaque to ultraviolet radiation for blocking ultraviolet radiation from cross-linking said cross-linkable tacky adhesive layer,
wherein said carrier structure includes a rectangular frame having a ledge providing the support member, and wherein said cover includes first and second covers disposed on opposite ends of said rectangular frame, wherein said first and second covers and said rectangular frame enclose said carrier base,
whereby one or more objects carried on said adhesive layer are released when said cover is removed and said adhesive layer is cross-linked by exposure to ultraviolet radiation applied through the transparent portion of the carrier base.

* * * * *